United States Patent
Braun

(10) Patent No.: US 8,111,845 B2
(45) Date of Patent: Feb. 7, 2012

(54) SYSTEM HAVING A PULSE WIDTH MODULATION DEVICE

(75) Inventor: Christoph Braun, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1235 days.

(21) Appl. No.: 11/780,815

(22) Filed: Jul. 20, 2007

(65) Prior Publication Data

US 2009/0022327 A1    Jan. 22, 2009

(51) Int. Cl.
- H03F 99/00 (2009.01)
- H03F 3/217 (2006.01)
- H04R 5/00 (2006.01)
- H03K 7/08 (2006.01)

(52) U.S. Cl. ............. 381/120; 381/1; 330/251; 375/238

(58) Field of Classification Search .................. 381/120, 381/121, 1, 74, 2; 330/10, 251, 207 A; 375/238
See application file for complete search history.

(56) References Cited

U.S. PATENT DOCUMENTS

| | | | |
|---|---|---|---|
| 6,950,527 B2 * | 9/2005 | Chu | 381/74 |
| 7,006,643 B2 * | 2/2006 | Anderson | 381/120 |
| 7,480,331 B2 * | 1/2009 | Braun | 375/238 |
| 7,486,155 B2 * | 2/2009 | Clara et al. | 332/109 |
| 7,554,391 B1 * | 6/2009 | Zuiss et al. | 330/10 |
| 7,557,622 B2 * | 7/2009 | Stanley | 327/131 |
| 7,816,980 B2 * | 10/2010 | Park | 330/10 |

* cited by examiner

Primary Examiner — Hai Phan
(74) Attorney, Agent, or Firm — Dicke, Billig & Czaja, PLLC

(57) ABSTRACT

A system, a device and a method for pulse width modulation is disclosed. One embodiment includes a pulse width modulation device, a first pulse width modulation mapper for pulse width modulation of a data signal, or a signal derived therefrom, and a second pulse width modulation mapper for pulse width modulation of a reference signal, or a signal derived therefrom. In one or more embodiments, the data signal e.g., can be a signal for a mono audio channel, or a signal for a stereo audio channel. The reference signal can be a signal including a constant signal level or a signal including a non-constant signal level an offset signal.

11 Claims, 3 Drawing Sheets

US 8,111,845 B2

SYSTEM HAVING A PULSE WIDTH MODULATION DEVICE

BACKGROUND

The present invention relates to a power amplifier, and to a system, a device and a method for pulse width modulation.

Modulation is the change of signal parameters of a carrier as a function of a signal to be modulated (base band signal).

Demodulation is a further modulation process that serves to retrieve the base band signal.

In a typical configuration of a communications system, a modulated signal is generated by a modulator provided at a corresponding terminal by using modulation from a carrier and a signal to be modulated. This modulated signal is, via a communication channel, transmitted to a demodulator provided at a further terminal.

As a carrier for the modulation, e.g., appropriate sinusoidal waves may be used, or—to an increasing degree—appropriate pulses.

In the case of sinusoidal carriers, the following signal parameters may, for instance, be influenced for modulation: amplitude, frequency, zero phase, etc., and in the case of pulse carriers, for instance, the signal parameters pulse amplitude, pulse frequency, pulse phase, and/or pulse duration (pulse width).

Pulse duration or pulse width modulation methods (PDM or PWM methods) are, for instance, used in entertainment electronics, e.g., for the modulation of audio and video signals.

A known method for digital pulse width modulation is for instance described in Jorge Varona, ECE University of Toronto: "Power Digital to Analog Conversion Using Sigma Delta and Pulse Width Modulations".

Further, DE 10350336.6, U.S. Ser. No. 10/976,074, Infineon Technologies, inventor: Ch. Braun, describes a pulse width modulation method in which a pulse width modulated signal is used as a feedback signal in a digital loop.

With a corresponding pulse width modulated signal for instance a Class-D amplifier may be triggered.

Conventional Class-D power amplifiers in general have an input stage and an output stage. In Class-D power amplifiers, the output stages are conventionally operated in a switching mode. This means that the output stage is either switched on or switched off.

In conventional Class-D power amplifiers, an (analogue digital) input signal is converted into a periodic sequence of pulses having a predetermined pulse frequency. The pulse width of a respective pulse e.g., may represent the amplitude of the input signal at one point in time. The pulse frequency is chosen to be at least twice as large as the maximum frequency of the input signal. Typically, the pulse frequency is e.g., ten or more times higher than the highest frequency of the input signal.

The above periodic sequence of pulses—i.e., the pulse width modulated signal—is input to a high power switching device, which generates a high power replica of the pulse width modulated signal. This amplified pulse width modulated signal is e.g., fed to a filter, which e.g., removes the high-frequency switching components of the PWM signal.

Conventionally, differential pulse width modulation is used in Class-D power amplifiers.

Class-D power amplifiers e.g., may be used for stereo audio signal amplification.

In the case of differential pulse width modulation, a Class-D stereo power amplifier in general has four outputs, which may be connected via a respective pair of cables to a respective pair of loudspeakers.

However, in the case of stereo earphones or headphones, Class-D power amplifiers with just three outputs are needed (as earphones or headphones in general only have three inputs, which are to be connected via three respective cables or wires to the respective Class-D power amplifier outputs).

Hence, if a Class-D power amplifier is to be provided which is to be used for earphones or headphones, conventionally, a respective DC middle potential is generated, which is provided at a first one of the above three Class-D power amplifier outputs. At a second one of the above three Class-D power amplifier outputs, e.g., a signal representing the "left" stereo channel is provided, and at a third one of the above three Class-D power amplifier outputs, e.g., a signal representing the "right" stereo channel. However, the disturbance behaviour and/or the loss factor of such Class-D power amplifiers may be relatively bad.

For these or other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

According to one embodiment, a pulse width modulation device is provided, including: a first pulse width modulation mapper for pulse width modulation of a data signal, or a signal derived therefrom, and a second pulse width modulation mapper for pulse width modulation of a reference signal, or a signal derived therefrom. The data signal for instance may be a signal for a mono audio channel, or for instance may be a signal for a stereo audio channel. The reference signal e.g., may be a signal including a constant signal level, or for instance may be a signal including a non-constant signal level, e.g., an offset signal, for instance a signal representing the offset between a data signal for the "right" (or the "left") and a further data signal for the other (e.g., the "left" (or the "right")) stereo audio channel.

Further features and advantages of the present invention will become apparent from the following detailed description of the invention made with reference to the accompanying drawings.

Figure 1:
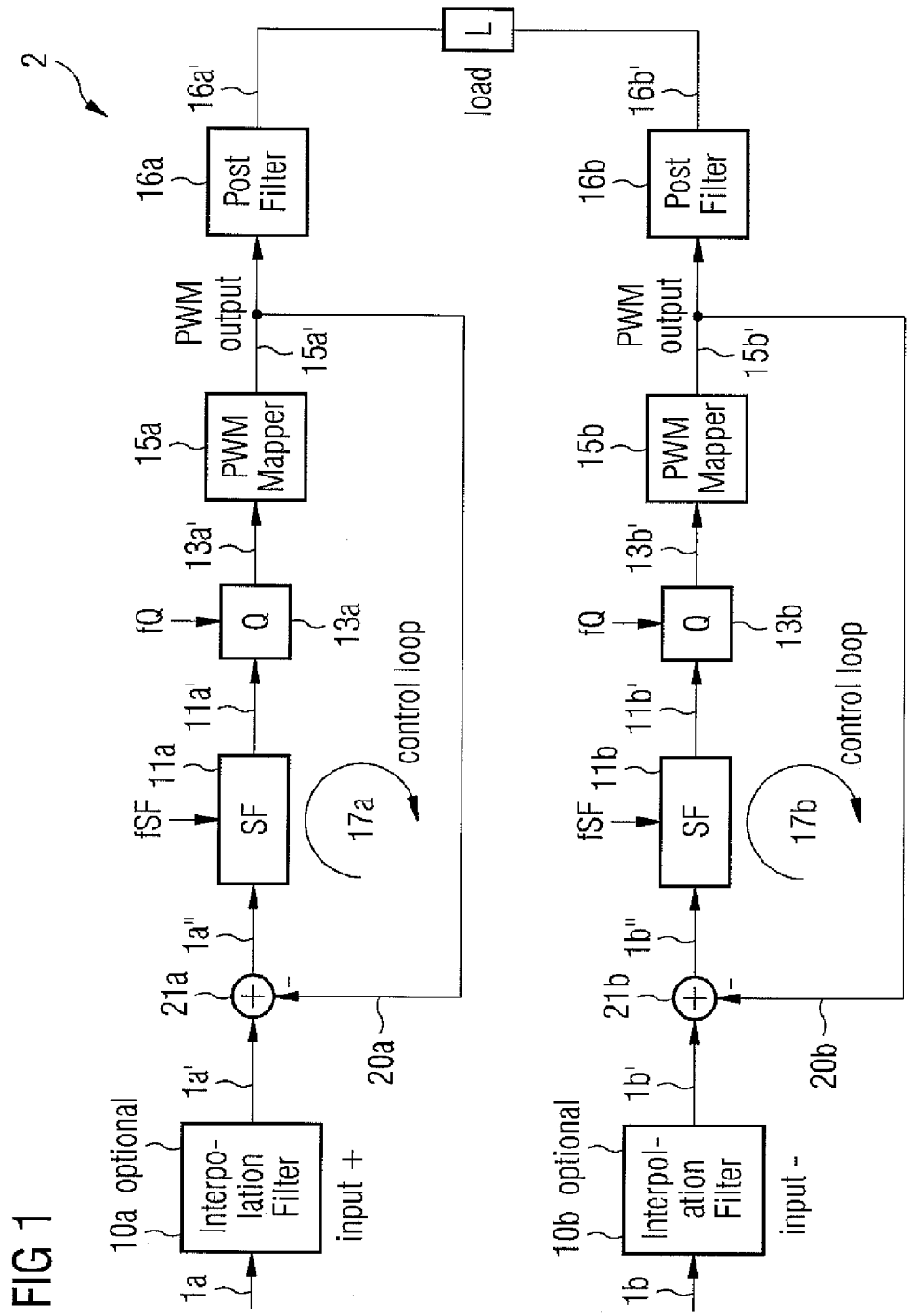
FIG. 1 illustrates a schematic, exemplary block diagram of an example of a conventional Class-D power amplifier system.

FIG. 1 illustrates a schematic, exemplary block diagram of an example of a conventional Class-D power amplifier system 2 (here: a Class-D mono amplifier system).

As is illustrated in FIG. 1, the system has two inputs 1a, 1b, here: a first input 1a ("+" input) and a second input 1b ("−" input).

At the first input 1a ("+" input) and the second input 1b ("−" input), a respective differential signal for a mono audio channel is applied.

As is further illustrated in FIG. 1, interpolation means 10a, 10b, e.g., respective interpolation filters, may—optionally—be provided in the system 2, by using which the respective digital input signals input at the above first and second inputs 1a, 1b are processed to respective digital loop input signals 1a', 1b'.

The digital loop input signals 1a', 1b' are fed to respective summation elements 21a, 21b.

By using the summation elements 21a, 21b, respective loop feedback signals 20a, 20b are subtracted from the digital loop input signals 1a', 1b', and the resulting signals 1a", 1b" are fed to respective filters 11a, 11b.

The filters 11a, 11b are operated at a filter sample rate fSF and output respective filter output signals 11a', 11b' that are fed to respective quantizers 13a, 13b.

By using the filters 11a, 11b and the quantizers 13a, 13b respective modified sigma-delta modulators are formed.

By the quantizers 13a, 13b, the filter output signals 11a', 11b' at the outputs of the filters 11a, 11b are quantized in the amplitude.

The quantizers 13a, 13b, are—compared with the filters 11a, 11b—operated at an independent quantizing sample rate fQ.

Respective output signals 13a', 13b' of the quantizers 13a, 13b are converted by respective pulse width modulation mappers 15a, 15b (PWM mappers 15a, 15b), and by use of respective conventional pulse width modulation methods to respective pulse signals 15a', 15b'.

The quantizers 13a, 13b operate at a different sample rate fQ than the filters 11a, 11b.

The ratio between the sample rate fSF of the filters 11a, 11b and the sample rate fQ of the quantizers 13a, 13b results from the resolution of the pulse signals 15a', 15b' generated by the PWM mappers 15a, 15b as e.g., $2^N$=fSF/fQ (wherein N corresponds to the number of bits of the quantizers 13a, 13b, or $2^N$ to the number of the possible time intervals between respective successive rising and falling edges of a respective pulse signal 15a', 15b').

As results from FIG. 1, the pulse signals 15a', 15b' generated by the PWM mappers 15a, 15b are fed to the above-mentioned summation elements 21a, 21b in negated form (i.e. serve as loop feedback signals 20a, 20b of respective control loops 17a, 17b including the filters 11a, 11b, the quantizers 13a, 13b, and the PWM mappers 15a, 15b, respectively).

Furthermore, the pulse signals 15a', 15b' generated by the PWM mappers 15a, 15b may be fed to a downstream (not illustrated) amplifier means, e.g., a class-D amplifier, and subsequently to respective post filters 16a, 16b that generate corresponding output signals 16a', 16b'.

By using the control loops 17a, 17b, a reduction of signal distortions can be achieved.

Figure 2:
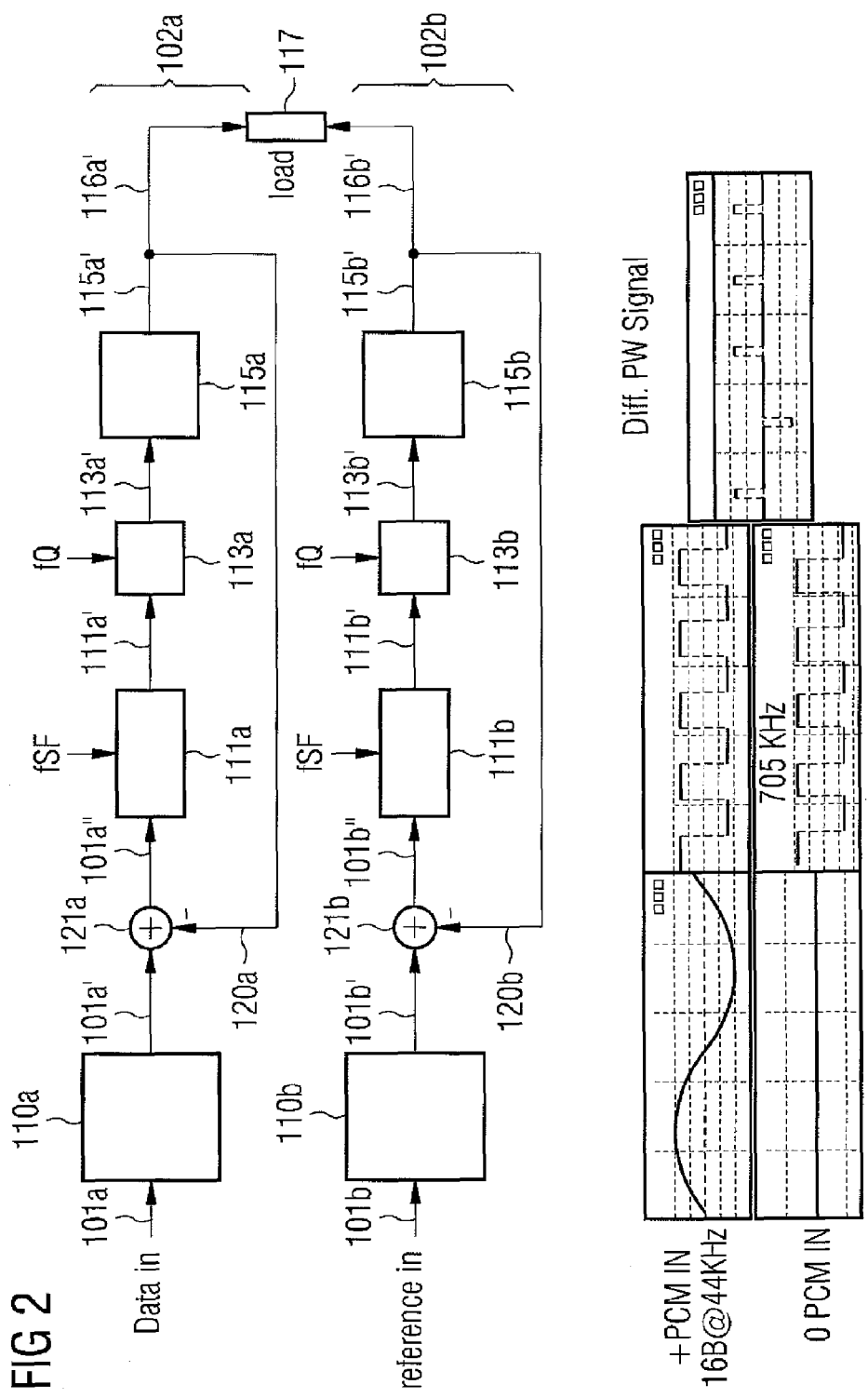
FIG. 2 illustrates a schematic, exemplary block diagram of a Class-D mono power amplifier system according to an embodiment of the present invention.

FIG. 2 illustrates a schematic, exemplary block diagram of a Class-D power amplifier system 102 according to an embodiment of the present invention (here: a Class-D mono power amplifier system).

As is illustrated in FIG. 2, the Class-D mono amplifier system 102 has two inputs 101a, 101b.

At a first input 101a, and as also illustrated in FIG. 2, an (analogue) digital signal for a mono audio channel is applied ("Data in"/"PCM IN").

Further, as also illustrated in FIG. 2, at a second input 101b, a reference signal is applied ("reference in"/"0 PCM IN").

In the case of the mono amplifier system 102 of FIG. 2, as a reference signal to be input at the second input 101b, e.g., a signal with a constant voltage level may be used, for instance a respective zero signal (e.g., a signal with a non-changing voltage level of 0V).

As is further illustrated in FIG. 2, interpolation means 110a, 110b, e.g., respective interpolation filters, may—optionally—be provided in the system 102, by using which the respective input signals input at the above first and second inputs 101a, 101b are processed to respective digital loop input signals 101a', 101b'.

The digital loop input signals 101a', 101b' are fed to respective summation elements 121a, 121b.

By using the summation elements 121a, 121b, respective loop feedback signals 120a, 120b are subtracted from the respective digital loop input signals 101a', 101b', and the resulting signals 101a", 101b" are fed to respective filters 111a, 111b.

The filters 111a, 111b e.g., may be operated at a filter sample rate fsF and output respective filter output signals 111a', 111b' that are fed to respective quantizers 113a, 113b.

By using the filters 111a, 111b and the quantizers 113a, 113b respective modified sigma-delta modulators may be formed.

By the quantizers 113a, 113b, the filter output signals 111a', 111b' at the outputs of the filters 111a, 111b are quantized in the amplitude.

The quantizers 113a, 113b, may—compared with the filters 111a, 111b—be operated at an independent quantizing sample rate of e.g., fQ.

Respective output signals 113a', 113b' of the quantizers 113a, 113b are converted by respective pulse width modulation mappers 115a, 115b (PWM mappers 115a, 115b) to respective pulse signals 115a', 115b'.

Thereby, any suitable pulse width modulation method may be used.

The quantizers 113a, 113b may operate at a different sample rate fQ than the filters 111a, 111b.

The ratio between the sample rate fSF of the filters 111a, 111b and the sample rate fQ of the quantizers 113a, 113b may e.g., result from the resolution of the pulse signals 115a', 115b' generated by the PWM mappers 115a, 115b as e.g., $2^N$=fSF/fQ (wherein N corresponds to the number of bits of the quantizers 113a, 113b, or $2^N$ to the number of the possible time intervals between respective successive rising and falling edges of a respective pulse signal 115a', 115b').

As results from FIG. 2, the pulse signal 115a' generated by the PWM mapper 115a is fed to the above-mentioned summation element 121a in negated form.

Correspondingly similar, the pulse signal 115b' generated by the PWM mapper 115b is fed to the above-mentioned summation element 121b, also in negated form.

Hence, the pulse signal 115a' serves as a loop feedback signal 120a of a respective first control loop/feedback loop including the filter 111a, the quantizer 113a, and the PWM mapper 115a, and the pulse signal 115b' serves as a loop feedback signal 120b of a respective second control loop/feedback loop including the filter 111b, the quantizer 113b, and the PWM mapper 115b.

By using the above control loops, a reduction of signal distortions may be achieved.

By the above summation element 121a, the filter 111a, the quantizer 113a, and the PWM mapper 115a (and—optionally—the above interpolation filter 110a), a PWM modulator 102a for the above (analogue) digital mono audio channel input signal 101a ("Data in") is provided. Further, by the above summation element 121b, the filter 111b, the quantizer 113b, and the PWM mapper 115b (and—optionally—the above interpolation filter 110b), a PWM modulator 102b for the above—constant—input signal 101b ("reference in") is provided, hence, a PWM modulator 102b for a "virtual ground".

Multiple other configurations of the two PWM modulators 102a, 102b are also conceivable. For instance, PWM modulators without control loops/feedback loops may be used (and/or—as already mentioned—without interpolation means/interpolation filters, etc., etc.).

The pulse signals 115a', 115b' generated by the PWM mappers 115a, 115b may—optionally—be fed to a downstream (not illustrated) amplifier means, e.g., a class-D amplifier, and subsequently—optionally—to respective post filters (also not illustrated) that generate corresponding output signals provided at a respective pair of lines 116a', 116b'.

The pulse signals 115a', 115b'/the output signals present at the pair of lines 116a', 116b' constitute a respective differential mono pulse width modulated audio signal ("Diff. PW Signal", see FIG. 2).

The differential mono pulse width modulated audio signal via the above pair of lines 116a', 116b' may be sent to a respective load 117, e.g., a respective loudspeaker, or respective earphones or headphones, etc.

At the load, a respective demodulation of the received differential mono pulse width modulated audio signal may be performed, e.g., by use of a process substantially inverse to the one described in connection with FIG. 2 above.

Figure 3:
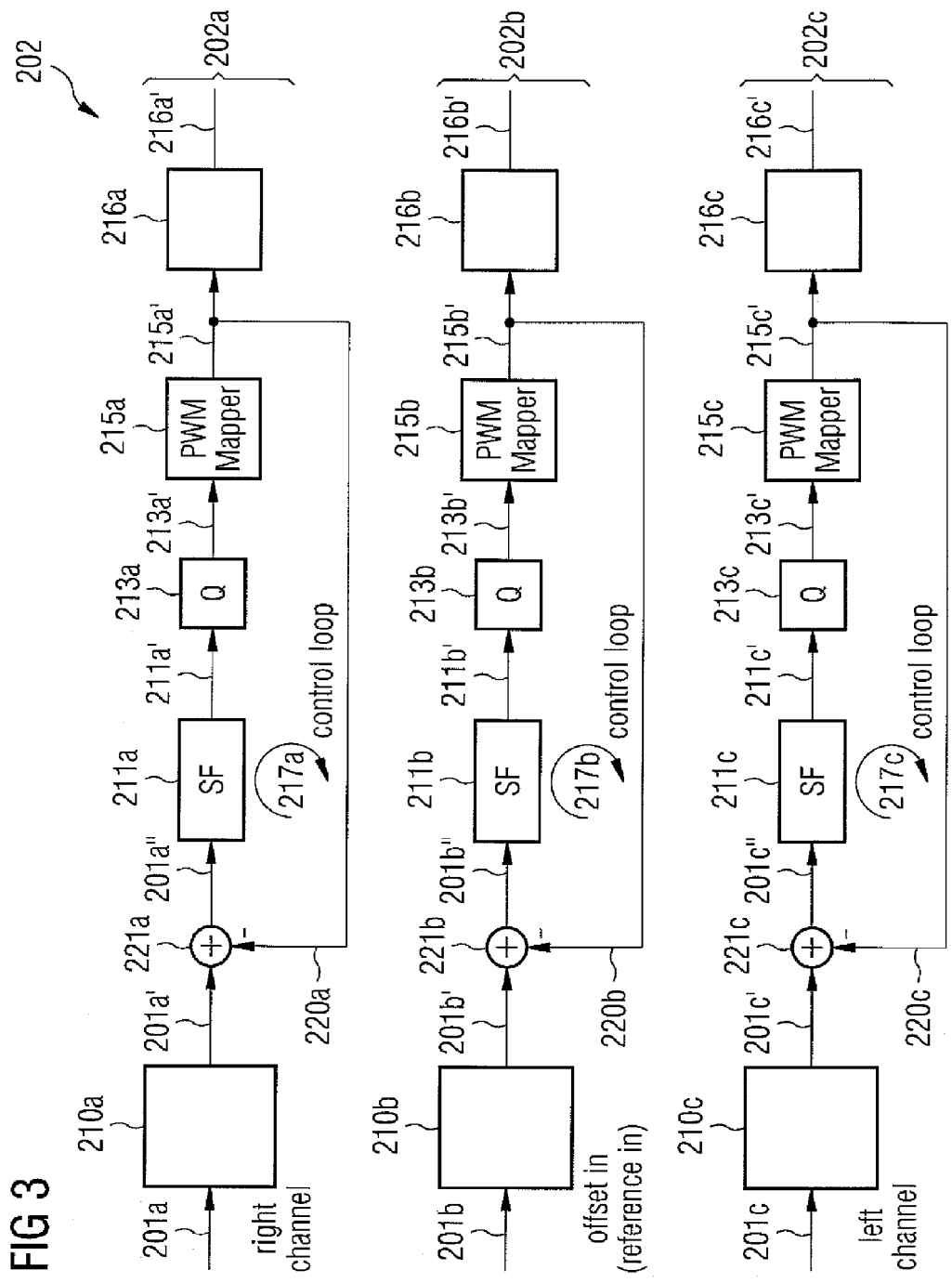
FIG. 3 illustrates a schematic, exemplary block diagram of a Class-D stereo power amplifier system according to a further embodiment of the present invention.

FIG. 3 illustrates a schematic, exemplary block diagram of a Class-D power amplifier system 202 according to a further embodiment of the present invention (here: a Class-D stereo power amplifier system).

As is illustrated in FIG. 3, the Class-D stereo amplifier system 202 has three inputs 201a, 201b, 201c.

At a first input 201a ("+ input"), and as also illustrated in FIG. 3, an (analogue) digital signal for e.g., a "right" (or "left") stereo audio channel is applied.

Correspondingly similar, at a third input 201c ("− input"), an (analogue) digital signal for the other stereo audio channel, i.e. a "left" (or "right") stereo audio channel is applied.

Further, as also illustrated in FIG. 3, at a second input 201b, a reference signal is applied ("reference in").

In the case of the stereo amplifier system 202 of FIG. 3, as a reference signal to be input at the second input 201b, e.g., a non-constant signal may be used, e.g., a signal representing the difference between the signal level of the signal present at the first input 201a ("+" input), and the signal level of the signal present at the third input 201c ("−" input), i.e., a signal representing the offset between the above (analogue) digital signals for the "right" and the "left" stereo audio channels (i.e. a signal representing the difference between the "+" and "−" input signals at the inputs 201a, 201c).

As is further illustrated in FIG. 3, interpolation means 210a, 210b, 201c, e.g., respective interpolation filters, may—optionally—be provided in the system 202, by using which the respective input signals input at the above first, second and third inputs 201a, 201b, 201c are processed to respective digital loop input signals 201a', 201b', 201c'.

The digital loop input signals 201a', 201b', 201c' are fed to respective summation elements 221a, 221b, 221c.

By using the summation elements 221a, 221b, 221c respective loop feedback signals 220a, 220b, 220c are subtracted from the respective digital loop input signals 201a', 201b', 201c' and the resulting signals 201a", 201b", 201c" are fed to respective filters 211a, 211b, 211c.

The filters 211a, 211b, 211c e.g., may be operated at a filter sample rate fsF and output respective filter output signals 211a', 211b', 211c' that are fed to respective quantizers 213a, 213b, 213c.

By using the filters 211a, 211b, 211c and the quantizers 213a, 213b, 213c respective modified sigma-delta modulators may be formed.

By the quantizers 213a, 213b, 213c the filter output signals 211a', 211b', 211c' at the outputs of the filters 211a, 211b, 211c are quantized in the amplitude.

The quantizers 213a, 213b, 213c may—compared with the filters 211a, 211b, 211c—be operated at an independent quantizing sample rate of e.g., fQ.

Respective output signals 213a', 213b', 213c' of the quantizers 213a, 213b, 213c are converted by respective pulse width modulation mappers 215a, 215b, 215c (PWM mappers 215a, 215b, 215c) to respective pulse signals 215a', 215b', 215c'.

Thereby, any suitable pulse width modulation method may be used.

The quantizers 213a, 213b, 213c may operate at a different sample rate fQ than the filters 211a, 211b, 211c.

The ratio between the sample rate fSF of the filters 211a, 211b, 211c and the sample rate fQ of the quantizers 213a, 213b, 213c may e.g., result from the resolution of the pulse signals 215a', 215b', 215c' generated by the PWM mappers 215a, 215b, 215c as e.g., $2^N=fSF/fQ$ (wherein N corresponds to the number of bits of the quantizers 213a, 213b, 213c or $2^N$ to the number of the possible time intervals between respective successive rising and falling edges of a respective pulse signal 215a', 215b', 215c').

As results from FIG. 3, the pulse signal 215a' generated by the PWM mapper 215a is fed to the above-mentioned summation element 221a in negated form.

The pulse signal 215b' generated by the PWM mapper 215b is fed to the above-mentioned summation element 221b, also in negated form.

In addition, the pulse signal 215c' generated by the PWM mapper 215c is fed to the above-mentioned summation element 221c (also in negated form).

Hence, the pulse signal 215a' serves as a loop feedback signal 220a of a respective first control loop 217a including the filter 211a, the quantizer 213a, and the PWM mapper 215a.

Further, the pulse signal 215b' serves as a loop feedback signal 220b of a respective second control loop 217b including the filter 211b, the quantizer 213b, and the PWM mapper 215b.

The pulse signal 215$c'$ serves as a loop feedback signal 220$c$ of a respective third control loop 217$c$ including the filter 211$c$, the quantizer 213$c$, and the PWM mapper 215$c$.

By using the above control loops, a reduction of signal distortions may be achieved.

By the above summation element 221$a$, the filter 211$a$, the quantizer 213$a$, and the PWM mapper 215$a$, a PWM modulator 202$a$ for the above (analogue) digital signal applied at the first input 201$a$ is provided, i.e., a PWM modulator for the "right" stereo audio channel.

By the above summation element 221$c$, the filter 211$c$, the quantizer 213$c$, and the PWM mapper 215$c$, a PWM modulator 202$c$ for the above (analogue) digital signal applied at the third input 201$c$ is provided, i.e., a PWM modulator for the "left" stereo audio channel.

Further, by the above summation element 221$b$, the filter 211$b$, the quantizer 213$b$, and the PWM mapper 215$b$, a PWM modulator 202$b$ for the above—non-constant—reference input signal ("reference in") applied at the second input 201$b$ is provided, i.e., a PWM modulator 202$b$ for "virtual ground" (here: a PWM modulator for the above signal representing the offset between the above (analogue) digital signals for the "right" and the "left" stereo audio channels).

Multiple other configurations of the above three PWM modulators 202$a$, 202$b$, 202$c$ are also conceivable. For instance, PWM modulators without control loops/feedback loops 217$a$, 217$b$, 217$c$ may be used (and/or—as already mentioned—without interpolation means/interpolation filters 210$a$, 210$b$, 210$c$, etc.).

The pulse signals 215$a'$, 215$b'$, 215$c'$ generated by the PWM mappers 215$a$, 215$b$, 215$c$ may—optionally—be fed to a downstream (not illustrated) amplifier means, e.g., a class-D amplifier, and subsequently—optionally—to respective post filters 216$a$, 216$b$, 216$c$ that generate corresponding output signals provided at respective lines 216$a'$, 216$b'$, 216$c'$.

The pulse signals 215$a'$, 215$b'$, 215$c'$/the output signals present at the three lines 216$a'$, 216$b'$, 216$c'$ (or cables or wires) constitute a respective "differential" stereo pulse width modulated audio signal.

The differential stereo pulse width modulated audio signal via the above lines/cables/wires 216$a'$, 216$b'$, 216$c'$ may be sent to a respective load, e.g., respective loudspeakers, or—particularly—respective earphones or headphones, etc.

For instance, the first line 216$a'$ may be connected with a first input of a respective earphone or headphone, the second line 216$b'$ may be connected with a second input of the earphone or headphone, and the third line 216$c'$ may be connected with a third input of the earphone or headphone, etc.

At the load, a respective demodulation of the received differential stereo pulse width modulated audio signal may be performed, e.g., by use of a process substantially inverse to the one described in connection with FIG. 3 above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system having a pulse width modulation device, comprising:
   a first pulse width modulation mapper for pulse width modulation of a data signal, or a signal derived therefrom;
   a second pulse width modulation mapper for pulse width modulation of a reference signal, or a signal derived therefrom; and
   a third pulse width modulation mapper for pulse width modulation of a further data signal, or a signal derived therefrom,
   wherein the data signal is a signal for a first stereo audio channel, the further data signal is a signal for a second stereo audio channel, and the reference signal is a signal representing the offset between the data signal for the first stereo audio channel, and the further data signal for the second stereo audio channel.

2. The system of claim 1, wherein the reference signal is a signal comprising a non-constant signal level.

3. The system of claim 1, wherein the first pulse width modulation mapper is included within a first control loop, and the second pulse width modulation mapper is included within a second control loop.

4. The system of claim 3, the first control loop further comprising a filter, and the second control loop further comprising a filter.

5. The system of claim 3, the first control loop further comprising a quantizer, and the second control loop further comprising a quantizer.

6. The system of claim 4, the first control loop adapted to feed back a signal generated by the first pulse width modulation mapper to the filter comprised by the first control loop, and the second control loop adapted to feed back a signal generated by the second pulse width modulation mapper to the filter comprised by the second control loop.

7. A power amplifier comprising:
   a first pulse width modulator for pulse width modulation of a signal applied at a data signal input, or a signal derived therefrom;
   a second pulse width modulator for pulse width modulation of a signal applied at a reference signal input, or a signal derived therefrom; and
   a third pulse width modulation mapper for pulse width modulation of a further data signal, or a signal derived therefrom,
   wherein the data signal is a signal for a first stereo audio channel, the further data signal is a signal for a second stereo audio channel, and the reference signal is a signal representing the offset between the data signal for the first stereo audio channel, and the further data signal for the second stereo audio channel.

8. The power amplifier of claim 7, wherein the amplifier is a Class-D power amplifier.

9. A system, comprising:
   a first pulse width modulator for pulse width modulation of a data signal, or a signal derived therefrom;
   a second pulse width modulator for pulse width modulation of a reference signal, or a signal derived therefrom; and
   a third pulse width modulator for pulse width modulation of a further data signal, or a signal derived therefrom, the system further comprising a load receiving output signals of the first, second and third modulators, or signals derived therefrom,
   wherein the data signal is a signal for a first stereo audio channel, the further data signal is a signal for a second stereo audio channel, and the reference signal is a signal representing the offset between the data signal for the first stereo audio channel, and the further data signal for the second stereo audio channel.

10. The system of claim 9, the load comprising at least one of: a loudspeaker, an earphone or a headphone.

11. A method for pulse width modulation, comprising:
carrying out a pulse width modulation of a data signal, or a signal derived therefrom;
carrying out a pulse width modulation of a reference signal, or a signal derived therefrom; and
carrying out a pulse width modulation of a further data signal, or a signal derived therefrom,
wherein the data signal is a signal for a first stereo audio channel, the further data signal is a signal for a second stereo audio channel, and the reference signal is a signal representing the offset between the data signal for the first stereo audio channel, and the further data signal for the second stereo audio channel.

* * * * *